United States Patent [19]
Klein et al.

[11] Patent Number: 5,103,183

[45] Date of Patent: Apr. 7, 1992

[54] METHOD OF PROFILING COMPENSATOR CONCENTRATION IN SEMICONDUCTORS

[75] Inventors: Robert S. Klein, Yorba Linda; Bradley L. Halleck, Mira Loma, both of Calif.

[73] Assignee: Rockwell International Corporation, El Segundo, Calif.

[21] Appl. No.: 471,152

[22] Filed: Jan. 26, 1990

[51] Int. Cl.$^5$ ............................................. G01R 31/26
[52] U.S. Cl ................................. 324/663; 324/158 D
[58] Field of Search ............... 324/662, 663, 683, 719, 324/158 R, 158 D; 437/8; 357/58, 14, 15

[56] References Cited

U.S. PATENT DOCUMENTS

| | | | |
|---|---|---|---|
| 3,248,579 | 7/1973 | Henry et al. | 324/719 |
| 3,518,545 | 6/1970 | Copeland, III | 324/719 |
| 4,115,736 | 9/1978 | Tracy | 324/158 F |
| 4,323,842 | 4/1982 | McGarrity et al. | 325/158 D |
| 4,325,025 | 4/1982 | Corcoran et al. | 324/158 R |
| 4,509,012 | 4/1985 | Lin | 324/158 D |
| 4,758,786 | 7/1988 | Hafeman | 324/158 D |
| 4,859,938 | 8/1989 | Kim et al. | 324/158 R |
| 4,896,202 | 1/1990 | Bharat et al. | 357/58 |
| 4,954,864 | 9/1990 | Maserjian | 357/58 |
| 4,962,304 | 10/1990 | Stapelbroek et al. | 357/58 |
| 4,978,915 | 12/1990 | Andrews, Jr. et al. | 324/158 D |

OTHER PUBLICATIONS

M. Petroff and M. Stapelbroek, "Responsivity and Noise Models of Blocked Impurity Band Detectors", IRIA-IRIS Speciality Group on Infrared Detectors, Aug. 1984.

R. Klein, "Characterization and Modeling of BIB Detectors using Capacitance Versus Voltage Measurements", IRIA-IRIS Speciality Group on Infrared Detectors, Aug. 1984.

J. Venzon, et al., "Automated Detector Material Characterization Capabilities", Test and Evaluation of Infrared Detectors and Arrays, SPIE vol. 1108, pp. 129-143 (Dec. 1989).

Primary Examiner—Kenneth A. Wieder
Assistant Examiner—Maura K. Regan
Attorney, Agent, or Firm—John C. McFarren

[57] ABSTRACT

A method is provided for making cryogenic capacitance-voltage (C-V) measurements of semiconductor epitaxial layers without the need for measuring fully processed devices. The method utilizes impurity hopping conduction to obtain a compensator concentration profile. In a preferred embodiment, a metal electrode is evaporated onto the bottom of the substrate of a semiconductor wafer having a heavily doped substrate, a heavily doped epitaxial layer, and an undoped epitaxial layer. A mask is used to form metal electrode capacitor dots on the top of the undoped layer. The cryogenic C-V measurement system comprises a Helitran dewar with a wafer holder and electrical connections, a temperature controller, measurement electronics, and a microcomputer. A programmable dc source is stepped and combined with an ac voltage supplied by a lock-in amplifier. A preamplifier converts the current from a capacitor electrode on the wafer to a voltage measured by a lock-in amplifier. The wafer output is processed by phase sensitive detection in the lock-in amplifier. The C-V measurements are controlled by the microcomputer during automatic progression through the voltage steps. Compensator concentration versus depth is calculated from the component of the measured current that is in-phase with a reference capacitance. A plot of compensator concentration versus depth can be displayed on a monitor and undated after each voltage step.

15 Claims, 1 Drawing Sheet

METHOD OF PROFILING COMPENSATOR CONCENTRATION IN SEMICONDUCTORS

TECHNICAL FIELD

The present invention relates to the fabrication of semiconductor devices and, in particular, to a method of determining the profile of compensator concentration in semiconductor epitaxial layers.

BACKGROUND OF THE INVENTION

An important factor in the fabrication of infrared detectors, such as solid state photomultipliers (SSPMs) and blocked impurity band (BIB) devices, is the strict control of acceptor and donor concentrations in the doped epitaxial layers of the detectors. In fact, the reduction and control of compensating acceptors in arsenic doped silicon (Si:As) impurity band conduction (IBC) devices, for example, has been identified as a key factor in improving detector performance. To optimize detector performance, the total unintended acceptor concentration should be kept below about the mid $10^{12}/cm^3$ range. Thus, an effective method of measuring compensator levels soon after fabrication of semiconductor epitaxial layers has been sought. The measurement process should be accurate, reliable, and able to provide a compensator concentration profile within hours of epitaxial growth on test wafers.

The technique of cryogenic capacitance versus voltage (C-V) measurement has been used to determine acceptor concentration profiles in n-type silicon and to determine donor concentration profiles in p-type silicon. As used for profiling compensator concentrations, the cryogenic C-V method involves measurement of the space charge in the depletion region of an MIS (metal-insulator-semiconductor) type of capacitor at low temperatures. At cryogenic temperatures, below about 20 degrees Kelvin, the undoped semiconductor layer in an IBC device acts like an insulator. The space charge in the depletion region is due to ionized compensators. The depletion region thickness, determined from the capacitance (C) per unit area, is changed by varying the applied voltage (V). This is the blocked impurity band detector model known in the prior art. In the case of an n-type semiconductor with low compensation at low temperature, the carriers are $D^+$ charges (i.e., electron vacancies on donors) in the impurity band. The resulting space charge in the region depleted of carriers is due to negatively charged acceptors.

As performed in the past, C-V methods required measurement of fully processed devices that took six weeks or more to fabricate. This limitation prevented the use of C-V techniques for fast characterization of epitaxial layers. As a result, these C-V methods could not be used for evaluating and selecting material for processing BIB detectors, SSPMs, or intrinsic event discriminators. Thus, there has been a need for a method of characterizing an epitaxial layer early in the process to improve and accelerate the fabrication of infrared detectors.

SUMMARY OF THE INVENTION

The present invention comprises a method of taking cryogenic capacitance-voltage measurements of epitaxial layers without the need for measuring fully processed devices. Unlike the high temperature C-V technique, which obtains the difference between majority and compensating impurity concentrations, the cryogenic C-V method of the present invention utilizes impurity hopping conduction to obtain the compensator concentration profile. A metal electrode is evaporated onto the bottom of the substrate of a wafer (typically for an SSPM or a BIB detector) having a very heavily doped substrate, a heavily doped epitaxial IR active layer, and an undoped epitaxial blocking layer. A mask is used to form metal electrode capacitor dots on the top of the undoped layer to provide contacts for the C-V measurements. The electrodes on the undoped layer have resistance sufficiently low when biased for the C-V measurements because the Schottky barrier arising from the metal-semiconductor interface is forward biased during the measurements.

A typical cryogenic C-V measurement system for performing the method of the present invention comprises a Helitran dewar with a wafer holder and electrical connections, a temperature controller, measurement electronics, and a microcomputer. A programmable dc source is stepped and combined with an ac voltage supplied by a lock-in amplifier. A preamplifier converts the current from a capacitor electrode on the wafer to a voltage measured by the lock-in amplifier. The lock-in amplifier analyzes the wafer output by phase-sensitive detection. A reference capacitor is used to set the reference phase. The C-V measurements are controlled by the microcomputer during automatic progression through the voltage steps. Compensator concentration and depth are calculated from the component of the measured current that is in-phase with the reference capacitance. A plot of compensator concentration versus depth is displayed on a monitor and updated after each voltage step.

BRIEF DESCRIPTION OF THE DRAWINGS

For a more complete understanding of the present invention and for further advantages thereof, the following Detailed Description of the Invention makes reference to the accompanying Drawings, in which.

DETAILED DESCRIPTION OF THE INVENTION

Figure 1:
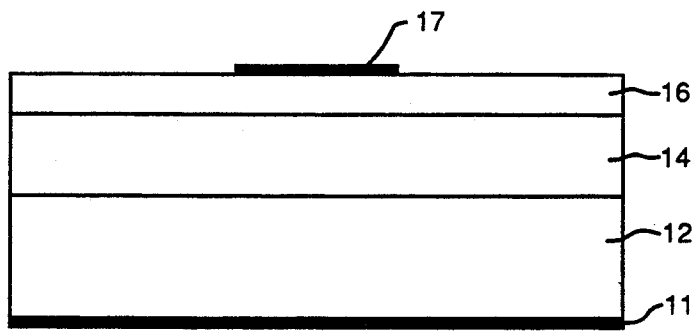
FIG. 1 is a cross section of a semiconductor wafer segment illustrating the electrodes used in performing cryogenic C-V measurements by the method of the present invention.

The present invention provides a fast method of cryogenic C-V measurement of compensator concentration levels in epitaxial layers of semiconductor devices. The method has been found to be particularly useful in determining the acceptor levels in semiconductor material used for fabricating n-type IBC devices. FIG. 1 illustrates a cross sectional segment of a typical IBC wafer 10 prepared for cryogenic C-V measurements according to the present method.

Referring to FIG. 1, wafer 10 comprises a very heavily doped n-type substrate 12, a heavily doped n-type epitaxial layer 14, and an undoped epitaxial layer 16. In a finished IR detector fabricated from wafer 10, layer 14 would comprise an IR active region and layer 16 would comprise a blocking layer. To prepare wafer 10 for cryogenic C-V measurements to characterize the acceptor concentration in layer 14, a metallic layer 11 is deposited on the bottom of substrate 12 and a mask (not shown) is used to form metallic dots, such as electrode 17, that form capacitor electrodes on the top of undoped layer 16. Electrode 17 may be formed with the mask by evaporation or sputtering of aluminum, for example, after the surface of layer 16 has been cleaned.

Although the present method provides a fast measurement of acceptor levels in n-type IBC wafers, several conditions must exist to assure valid results. First, the majority impurity concentration must be sufficiently high to provide significant hopping conduction. This requirement prevents profiling of acceptor impurities in the blocking layer, for example. Second, the donor concentration must not be so high that conduction will occur by itinerant carriers of the wrong sign in doubly occupied impurity states (upper Hubbard band). The donor concentration of the IR active layer in Si:As IBC devices, which typically ranges from $4 \times 10^{17}$ to $10^{18}/cm^3$, is in a range where cryogenic C-V measurements are possible. A final limitation is that the dark current cannot be too high. Higher acceptor concentration results in higher dark current for a given depletion depth. Thus, there is a limit to the depth to which an epitaxial layer can be characterized.

Figure 2:
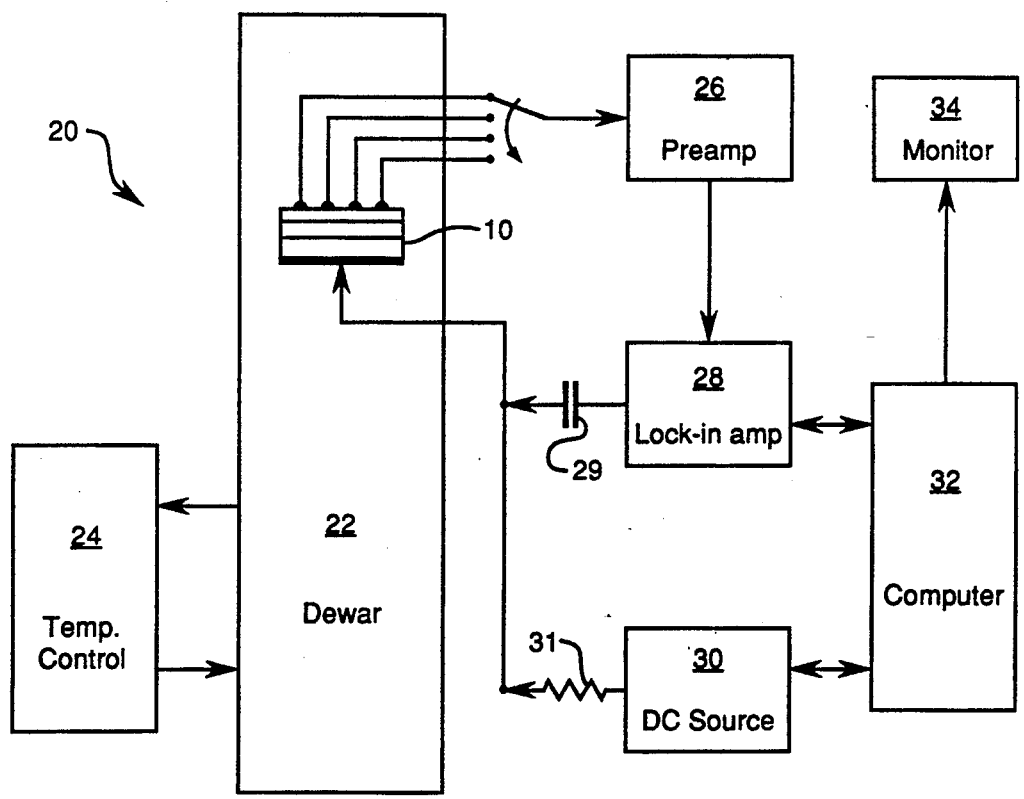
FIG. 2 is a block diagram of a system for performing cryogenic C-V measurements by the method of the present invention.

FIG. 2 is a block diagram of a system 20 for performing cryogenic C-V measurements according to the method of the present invention. IBC wafer 10 is illustrated with four probes in contact, respectively, with four capacitor dot electrodes formed on the top surface. A single probe is connected to the metallic electrode on the bottom of the substrate. A wafer holder (not shown) positions wafer 10 in contact with the probes inside a Helitran dewar 22. The probes provide electrical measurement data from four sample locations on wafer 10. A temperature controller 24 provides and regulates cryogenic temperatures inside dewar 22.

The measurement electronics of cryogenic C-V system 20 include a current preamplifier 26, a lock-in amplifier 28, and a programmable dc source 30. A dc bias supplied by source 30 is combined with an ac voltage provided by lock-in amplifier 28. A simple RC circuit comprising capacitor 29 and resistor 31 combines the two voltages and supplies them through the probe to the bottom electrode on the substrate of wafer 10. Preamplifier 26 selectively samples the current from the capacitor dot electrodes on the top surface of wafer 10. Preamplifier 26 converts the current from the dot electrodes to a voltage that is input to lock-in amplifier 28. Amplifier 28 provides phase-sensitive detection of the output from the dot electrodes of wafer 10. The probes to wafer 10 may comprise coaxial cables, with cable capacitance having negligible effect on the measurements. The effect of the cable capacitance is negligible because the output impedances of the ac source circuit 28, 29 and the dc source circuit 30, 31 are low and the input impedance of preamp 26 is low. Measurement and control for system 20 are provided by a microcomputer 32. Computer 32 controls the voltage step progression of source 30 and analyzes the wafer output data provided by lock-in amplifier 28. Computer 32 calculates the compensating impurity concentration and depth in the IR active layer of wafer 10 by analyzing the component of the wafer current that is in-phase with the capacitance. Phase calibration can be accomplished by substituting a mica capacitor for wafer 10 in the circuit. A plot of compensator concentration versus depth can be displayed on a monitor 34 and updated after each voltage step from source 30. A completed plot can be printed at the end of the progression of test voltages from source 30.

The present method is useful in quantitatively profiling the concentration of both deep and shallow compensators and characterizing sharp gradients in compensator concentration. This capability is important in the fabrication of SSPMs where appropriate compensation gradients are needed for optimal performance.

Although the present invention has been described with respect to a specific embodiment thereof, various changes and modifications may be suggested to one skilled in the art. Therefore, it is intended that the present invention encompass such changes and modifications as fall within the scope of the appended claims.

We claim:

1. A method of determining compensator concentration in a doped semiconductor, comprising the steps of:
   depositing an undoped semiconductor layer atop the doped semiconductor;
   providing an electrical contact to the doped semiconductor;
   providing a metallic capacitor electrode atop and in direct contact with said undoped semiconductor layer;
   providing a cryogenic environment for the doped semiconductor, electrical contact, undoped semiconductor layer, and metallic electrode;
   calibrating capacitance phase using a reference capacitance;
   applying a voltage to said electrical contact and measuring ac current versus voltage at said metallic capacitor electrode in said cryogenic environment; and
   analyzing said ac current versus voltage measurement to determine the compensator concentration of the doped semiconductor.

2. The method of claim 1, wherein the step of measuring ac current versus voltage includes phase sensitive detection.

3. The method of claim 2, wherein the step of analyzing said ac current versus voltage measurement includes determining the compensator concentration at different depths in the doped semiconductor.

4. The method of claim 3, wherein the doped semiconductor comprises a substrate having a doped epitaxial layer atop said substrate, and the step of providing an electrical contact comprises forming a metallic contact on the bottom of said substrate.

5. The method of claim 4, wherein the step of depositing an undoped semiconductor layer comprises forming an undoped semiconductor epitaxial layer atop said doped epitaxial layer.

6. The method of claim 5, wherein the step of providing a metallic capacitor electrode comprises using a mask to form a metallic dot on top of said undoped semiconductor epitaxial layer.

7. The method of claim 6, wherein the step of applying a voltage comprises combining an ac voltage with a dc bias voltage.

8. The method of claim 7, wherein the step of applying a voltage further comprises applying said dc bias voltage in a programmed series of dc voltage steps.

9. A method of profiling compensator concentration in a doped epitaxial layer on a semiconductor substrate, comprising the steps of:
   depositing an undoped semiconductor epitaxial layer atop said doped epitaxial layer;

depositing an electrical contact on the bottom of the substrate;

depositing a metallic capacitor electrode atop and in direct contact with said undoped semiconductor layer;

providing a cryogenic environment for the substrate, epitaxial layers, contact, and metallic electrode;

combining an ac voltage with dc bias voltages generated in programmed steps;

applying said combined voltages to said electrical contact and measuring ac current versus voltage at said metallic capacitor electrode in said cryogenic environment; and analyzing said ac current versus voltage measurements with phase sensitive detection to determine the compensator concentration profile of the doped epitaxial layer.

10. The method of claim 9, wherein the step of analyzing includes the step of calibrating capacitance phase using a reference capacitance.

11. The method of claim 10, wherein the step of measuring ac current versus voltage comprises detecting a component of a current from said metallic capacitor electrode that is in-phase with the reference capacitance.

12. The method of claim 11, wherein the step of analyzing comprises determining compensator concentration versus depth from said detected in-phase component of said metallic capacitor electrode current.

13. A method of characterizing acceptor concentration in an IR active layer of an n-type IBC detector, comprising the steps of:

depositing a doped n-type epitaxial layer atop a heavily doped n-type semiconductor substrate;

depositing an undoped semiconductor epitaxial layer atop said doped epitaxial layer;

providing an electrical contact on the bottom of the substrate;

depositing a metallic capacitor electrode atop and in direct contact with said undoped semiconductor layer;

providing a cryogenic environment for the substrate, epitaxial layers, contact, and electrode;

calibrating capacitance phase using a reference capacitance;

combining an ac voltage with stepped dc bias voltages;

applying said combined voltages to said electrical contact and measuring ac current versus voltage at said metallic capacitor electrode in said cryogenic environment; and analyzing said ac current versus voltage measurements by phase sensitive detection to determine an acceptor concentration profile of the doped n-type epitaxial layer.

14. The method of claim 13, wherein the step of measuring ac current versus voltage comprises detecting a component of the current at said metallic capacitor electrode that is in-phase with the reference capacitance.

15. The method of claim 14, wherein the step of analyzing comprises determining acceptor concentration versus depth from said detected in-phase component of the capacitor electrode current.

* * * * *